United States Patent
Zachariah et al.

[11] Patent Number: 6,113,983
[45] Date of Patent: Sep. 5, 2000

[54] METHOD OF FORMING METALLIC AND CERAMIC THIN FILM STRUCTURES USING METAL HALIDES AND ALKALI METALS

[75] Inventors: Michael R. Zachariah, Tucson, Ariz.; Jay H. Hendricks, Ellicott City, Md.

[73] Assignee: The United States of America as represented by the Secretary of Commerce, Washington, D.C.

[21] Appl. No.: 09/054,401

[22] Filed: Apr. 3, 1998

Related U.S. Application Data

[60] Provisional application No. 60/041,965, Apr. 3, 1997, and provisional application No. 60/061,443, Oct. 9, 1997.

[51] Int. Cl.$^7$ ............................................. C23C 16/00
[52] U.S. Cl. .................... 427/253; 427/250; 427/255.23; 427/255.28; 427/255.39; 427/255.391; 427/255.394
[58] Field of Search ..................... 427/250, 253, 427/255.23, 255.19, 255.28, 255.39, 255.394, 255.391, 314

[56] References Cited

U.S. PATENT DOCUMENTS

| | | | |
|---|---|---|---|
| 3,244,482 | 4/1966 | Culbertson et al. | 23/204 |
| 4,812,301 | 3/1989 | Davidson et al. | 423/440 |
| 4,861,623 | 8/1989 | Ueki et al. | 427/69 |
| 5,021,221 | 6/1991 | Gould et al. | 422/129 |
| 5,091,209 | 2/1992 | Claverie et al. | 427/38 |
| 5,149,514 | 9/1992 | Sanjorjo et al. | 423/344 |
| 5,175,017 | 12/1992 | Kobayashi et al. | 427/8 |
| 5,453,124 | 9/1995 | Moslehi et al. | 118/715 |
| 5,498,446 | 3/1996 | Axelbaum et al. | 427/212 |
| 5,545,436 | 8/1996 | Saito | 427/255.3 |
| 5,595,784 | 1/1997 | Kaim et al. | 427/255.2 |
| 5,693,368 | 12/1997 | Ackerman et al. | 427/253 |
| 5,700,519 | 12/1997 | Lam | 427/253 |

OTHER PUBLICATIONS

Pierson, "Handbook Of Chemical Vapor Deposition (CVD) Principles, Technology and Applications", Noyes Publications pp. 1–7 and 395–396, 1992.

Primary Examiner—Roy V. King
Attorney, Agent, or Firm—Law Offices of Lalos & Keegan

[57] ABSTRACT

A new low temperature method for nanostructured metal and ceramic thin film growth by chemical vapor deposition (CVD) involves the use of a low pressure co-flow diffusion flame reactor to react alkali metal vapor and metal halide vapor to deposit metal, alloy and ceramic films. The reaction chemistry is described by the following general equation:

$$(mn)\text{Na} + n\text{MX}_m \rightarrow (\text{M})_n + (nm)\text{NaX}$$

where Na is sodium, or another alkali metal (e.g., K, Rb, Cs), and $\text{MX}_m$ is a metal-halide (M is a metal or other element such as Si, B or C; X is a halogen atom, e.g., chlorine, fluorine or the like; and m and n are integers). This reaction chemistry is a viable technique for thin film growth. In one mode, using the precursors of sodium metal vapor, titanium tetrachloride (the limiting reagent), and either argon or nitrogen gases, titanium (Ti), titanium nitride (TiN), titanium dioxide ($\text{TiO}_2$), and titanium silicide (TiSi, $\text{Ti}_5\text{Si}_3$, $\text{TiSi}_2$, $\text{Ti}_5\text{Si}_4$) thin films have been successfully grown on copper and silicon substrates. Conditions can be adjusted to prevent or minimize gas-phase particle nucleation and growth. Substrate temperatures can also be varied to prevent excessive salt deposition.

18 Claims, 13 Drawing Sheets

FIG. 11
CVD REACTOR CONDITIONS

| Sample Code | Coating Film | Substrate Material | Reactants | Press Torr | $N_a$ (g) SLPM[a] | Ar (g) SCCM[b] | $TiCl_{4[g]}$ SCCM[b] | Na (g) SCCM[b] | Time Hrs.[c] | T °C[d] | Vel- cm/s[e] |
|---|---|---|---|---|---|---|---|---|---|---|---|
| R23 | NaCl, Ti | Si<100> | Na,Ar, TiCl4 | 6.00 | 0.0 | 3.6 | $2.9 \times 10^{-3}$ | $1.2 \times 10^{-2}$ | 6.5 | 435 | 1900 |
| R11 | NaCl, Ti | Si<100> | Na,Ar, TiCl4 | 6.00 | 0.0 | 3.6 | $2.9 \times 10^{-3}$ | $5.1 \times 10^{-2}$ | 4.0 | 260 | 1900 |
| R23W | Ti | Si<100> | Na,Ar, TiCl4 | 6.00 | 0.0 | 3.6 | $2.9 \times 10^{-3}$ | $1.2 \times 10^{-2}$ | 6.5 | 435 | 1900 |
| R22 | $Ti_xSi_y$ | Si<100> | Na,Ar, TiCl4 | 6.00 | 0.0 | 3.6 | $2.9 \times 10^{-3}$ | $1.6 \times 10^{-2}$ | 5.2 | 601 | 1900 |
| R15 | None | Si<100> | Ar, TiCl4 | 6.00 | 0.0 | 3.6 | $2.9 \times 10^{-3}$ | None | 5.5 | 610 | 1900 |
| R25 | Ti | OFHC Cu | Na,Ar, TiCl4 | 6.00 | 0.0 | 3.6 | $2.9 \times 10^{-3}$ | $1.4 \times 10^{-2}$ | 6 | 610 | 1900 |
| R26 | Ti | OFHC Cu | Na,Ar, TiCl4 | 6.00 | 0.0 | 3.6 | $1.0 \times 30^{-3}$ | $1.6 \times 10^{-2}$ | 6.5 | 610 | 1900 |
| R30 | Ti | OFHC Cu | Na,Ar, TiCl4 | 50.00 | 0.0 | 3.6 | $2.9 \times 10^{-3}$ | $3.8 \times 10^{-2}$ | 5 | 610 | 230 |
| R32 | Ti | OFHC Cu | Na,Ar, TiCl4 | 50.00 | 0.0 | 3.6 | $2.9 \times 30^{-3}$ | $5.6 \times 10^{-2}$ | 5.5 | 610 | 230 |
| R29 | TiN | OFHC Cu | Na,Ar, TiCl4 | 6.00 | 3.6 | 0.0 | $3.3 \times 10^{-3}$ | $5.3 \times 10^{-2}$ | 5.5 | 610 | 1900 | a Standard Liters per Minute
b Standard Cubic Centimeters per Minute
c Deposition Time
d Substrate Temperature
e Reaction Exit Velocity

FIG. 12

POTENTIAL FILMS WHICH CAN BE GROWN WITH THE
SODIUM/METAL HALIDE CVD REACTOR VS. CONVENTIONAL CVD

| Proposed Film Material | Conventional CVD Temperature | This Method | Reactant Feed Stock for the Metal Halide in Equation (1) |
|---|---|---|---|
| Ti | 950-1100°C | 610°C | $TiCl_4$ |
| TiC | 950-1100°C | 610°C | $TiCl_4$ and $CCl_4$ |
| Si | 950-1080°C | 610°C | $SiCl_4$ or $SiHCl_3$ |
| Ta | 900-1000°C | 610°C | $TaCl_5$ |
| $TiB_2$ | 950-1100°C | 610°C | $TiCl_4 + BCl_3$ |
| SiC | >1100°C | 610°C | $SiCl_4 + CCl_4$ or $SiHCl_3 = CCl_4$ |

FIGURE 13

| Peak[a] Fig. 5b | Peak Position (2-theta) | Compound | CAS Reference Number[b] | CAS Ref. Position (2-theta) | Crystal Orientation (h, k, i) |
|---|---|---|---|---|---|
| 1 | 40.0 | $TiSi_2$<br>Ti<br>$TiSi_2$ | 10-0225<br>44-1294<br>10-0225 | 39.3<br>40.2<br>40.4 | (060)<br>(010)<br>(131) |
| 2 | 41.1 | $Ti_5Si_2$<br>TiSi<br>$Ti_5Si_4$ | 29-1362<br>12-0424<br>27-0907 | 41.0<br>41.2<br>41.6 | (211)<br>(211)<br>(115) |
| 3 | 42.4 | $Ti_5Si_4$<br>$Ti_5Si_3$<br>$Ti_5Si_2$<br>$Ti_5Si_4$<br>$Ti_5Si_3$<br>$Ti_5Si_4$ | 23-1079<br>29-1362<br>35-0785<br>27-0907<br>29-1362<br>23-1079 | 42.0<br>42.0<br>42.2<br>42.2<br>42.7<br>42.7 | (124)<br>(300)<br>(040)<br>(214)<br>(112)<br>(006) |
| 4 | 44.8 | $Ti_5Si_4$<br>$Ti_5Si_3$<br>TiSi<br>$Ti_5Si_4$ | 27-0907<br>29-1362<br>17-0424<br>24-1079 | 44.2<br>45.1<br>45.3<br>45.3 | (223)<br>(202)<br>(301)<br>(025) |
| 5 | 51.4 | $Ti_5Si_3$<br>$Ti_5Si_4$ | 29-1362<br>23-1079 | 51.0<br>51.5 | (310)<br>(026) |
| 6 | 61.7 | $Ti_5Si_4$<br>$Ti_5Si_4$ | 27-0907<br>27-0907 | 61.6<br>61.7 | (306)<br>(420) | a Peak Numbers Refer to Figure 5B
b Cas Reference materials were powder samples

METHOD OF FORMING METALLIC AND CERAMIC THIN FILM STRUCTURES USING METAL HALIDES AND ALKALI METALS

CROSS-REFERENCE TO RELATED APPLICATIONS

This application claims priority to U.S. Provisional Application No. 60/041,965, filed Apr. 3, 1997, and U.S. Provisional Application No. 60/061,443, filed Oct. 9, 1997.

FIELD OF THE INVENTION

The present invention is directed to a method of forming thin film structures using chemical vapor deposition and, in particular, forming thin films by a gaseous-phase reaction between gaseous metal halides and alkali metal gases.

BACKGROUND ART

The worldwide market for Chemical Vapor Deposition (CVD) equipment and services is projected to grow from $3.5 billion (per year) in 1995 to $5.4 billion by the year 2000. The two major industrial sectors are: (a) microelectronics which currently accounts for approximately 80% of the market, and (b) surface coatings applications (surface hardness enhancement, corrosion inhibition, and medical) which accounts for the remaining 20% of the market. The microelectronics industry is concerned with stringent purity requirements, while the surface coatings industry is primarily concerned with surface hardening (for machine tooling) and surface coating (for corrosion inhibition and medical applications). While the microelectronics industry can incur a significant expense to produce a high-purity film with exacting electrical performance, many surface enhancement applications cannot tolerate the high production costs typical of the present-day CVD techniques. Additional challenges that both industries face are the expense of disposing of CVD byproducts and the high surface temperature requirement for many conventional CVD processes (900° C. to 1200° C. for thermal CVD of titanium). This latter point is of significance because many substrates may not be capable of accepting high deposition temperatures. For example, mild steel (less than 0.25% C) undergoes a phase transition at elevated temperatures e.g., 723° C., such a change affecting the steel's properties.

Various techniques have been proposed to form thin films using CVD. One technique uses halides such as titanium halide with silanes and ammonia as disclosed in U.S. Pat. No. 5,595,784 to Kaim et al.

In spite of the prior art techniques known to date, a need has developed to provide a CVD process for making thin films on substrates that is low cost, is environmentally benign, uses low temperatures and provides reasonable purity levels. The present invention solves this need by developing a CVD technique that uses a metal-containing halide vapor and an alkali metal vapor to produce a thin film structure.

The generation of bulk titanium by reacting titanium halide vapor and sodium vapor is known. This chemistry has also been demonstrated to be useful for a variety of applications including the synthesis of titanium nanoparticles and $TiB_2$ nanoparticles, for the formation of an iron/salt magnetic nanocomposites, for the study of phase segregation in binary $SiO_2/TiO_2$ and $SiO_2/Fe_2O_3$ nanoparticles, for the synthesis of high purity Si (near photovoltaic grade, and for the remediation of chlorinated fluorocarbons (CFC's))

However, the use of alkali metals, e.g., sodium and potassium, has not been suggested for use in industrial chemical vapor deposition applications primarily because their reductive power is so great that it tends to cause premature and detrimental gas-phase particle precipitation. Furthermore, the deposition of salts is problematic in that high temperatures are required to volatilize the deposited salt.

SUMMARY OF THE INVENTION

Accordingly, it is a first object of the present invention to provide an improved chemical vapor deposition method for making thin films of metals, alloys and ceramic materials.

Another object of the present invention is to provide a low temperature method of chemical vapor deposition.

A still further object of the present invention is to provide a thin film chemical vapor deposition method that suppresses formation of large particles during gas-phase reaction of the method.

One other object of the present invention is to provide an apparatus for making thin film structures.

Yet another object of the invention is a chemical vapor deposition method which produces environmentally benign by-products.

Other objects and advantages of the present invention will become apparent as a description thereof proceeds.

In satisfaction of the foregoing objects and advantages, the present invention, in one mode, demonstrates that a low temperature (600° C.) alkali metal/metal halide reaction can be run at conditions under-saturated in salt, and that a salt-free, low temperatures CVD film can be achieved. The high reductive power of alkali metals such as sodium or potassium now becomes a benefit in that the thermodynamics so strongly favor the production of salt that there is no inherent need to heat the substrate in order to drive the reaction chemistry (as is typically done in many CVD processes). If desired, problematic gas-phase particle formation, and salt deposition can be avoided by using dilute reactant concentrations and moderate substrate temperatures, thereby allowing the production of a salt free film.

In another mode, the invention entails a method of forming a thin film of material on a substrate comprising the steps of providing a first precursor gas comprising an alkali metal and at least one second precursor gas comprising a halide compound gas wherein the halide compound includes at least one component of the material. The first and second precursor gases are reacted under gaseous and vacuum conditions to form the material and deposit the material on the substrate. The first precursor gas can be an alkali metal selected from the elemental group IA consisting of sodium, potassium, rubidium and cesium and the halide compound includes metals, non-metals, semiconductors, and combinations thereof. The metal can be selected from the group of the Group IIIB, IVB, VB, VIB, VIIB, VIIIB, IA, IIA, IIIA, IVA, VA, and VIA elements and combinations thereof. The non-metal or semiconductor can be selected from the groups consisting of IIIA (Boron), IVA (Carbon and Silicon), VA, and VIA. The halide compound includes a halogen element selected from the group VIIA consisting of chlorine, fluorine, bromine and iodine.

The method can further comprise a carrier gas as part of the reacting step wherein the carrier gas can be non-reactive or reactive or a combination of both, e.g., oxygen, nitrogen, argon, helium or the like. The carrier gas can be included as part of the first and second precursor gases or added separate thereto.

Preferably, the first and second precursor gases are introduced into a reaction chamber as co-flows, more preferably with a separator gas therebetween. The separator gas can be the same or different from the carrier gas.

Examples of the metal halides include $TiCl_4$, $SiCl_4$, $SiHCl_3$, $TaCl_5$, $BCl_3$, $CCl_4$, and combinations thereof. Pressures, temperatures and gas concentrations can vary depending on the reactants. Preferably, the temperature is less than 900° C. and the pressure is less than 100 torr.

The invention also includes an apparatus to practice the method, the apparatus comprising a source of a first precursor gas including at least an alkali metal and a source of at least one second precursor halide compound gas wherein the halide compound includes at least one component of the material. The apparatus also has a sealed vacuum vessel having a substrate holder for supporting a substrate and an annular nozzle, a central passage of the nozzle in communication with the first precursor gas and an outer passage in communication with the second precursor gas, the first and second precursor gases reacting upon exiting the nozzle to form the material and deposit it on a substrate on the substrate holder. The nozzle can include a separator passage interposed between the central and outer passages, the separator passage in communication with a source of one of a reactive and a non-reactive gas. The substrate holder can be heated if desired. A mass flow controller can be provided as part of each source of gas for each of the first and second precursor gases. A source of a reactive or a non-reactive gas can be in communication with the central passage and the outer passage.

BRIEF DESCRIPTION OF THE DRAWINGS

Reference is now made to the drawings of the invention wherein:

FIG. 11 is a table of CVD reactor conditions;

FIG. 12 is a table of the potential films which can be grown with the sodium/metal halide CVD reactor vs. a conventional CVD; and FIG. 13 is a table of the XRD analysis of sample R22.

DESCRIPTION OF THE PREFERRED EMBODIMENTS

Figure 1:
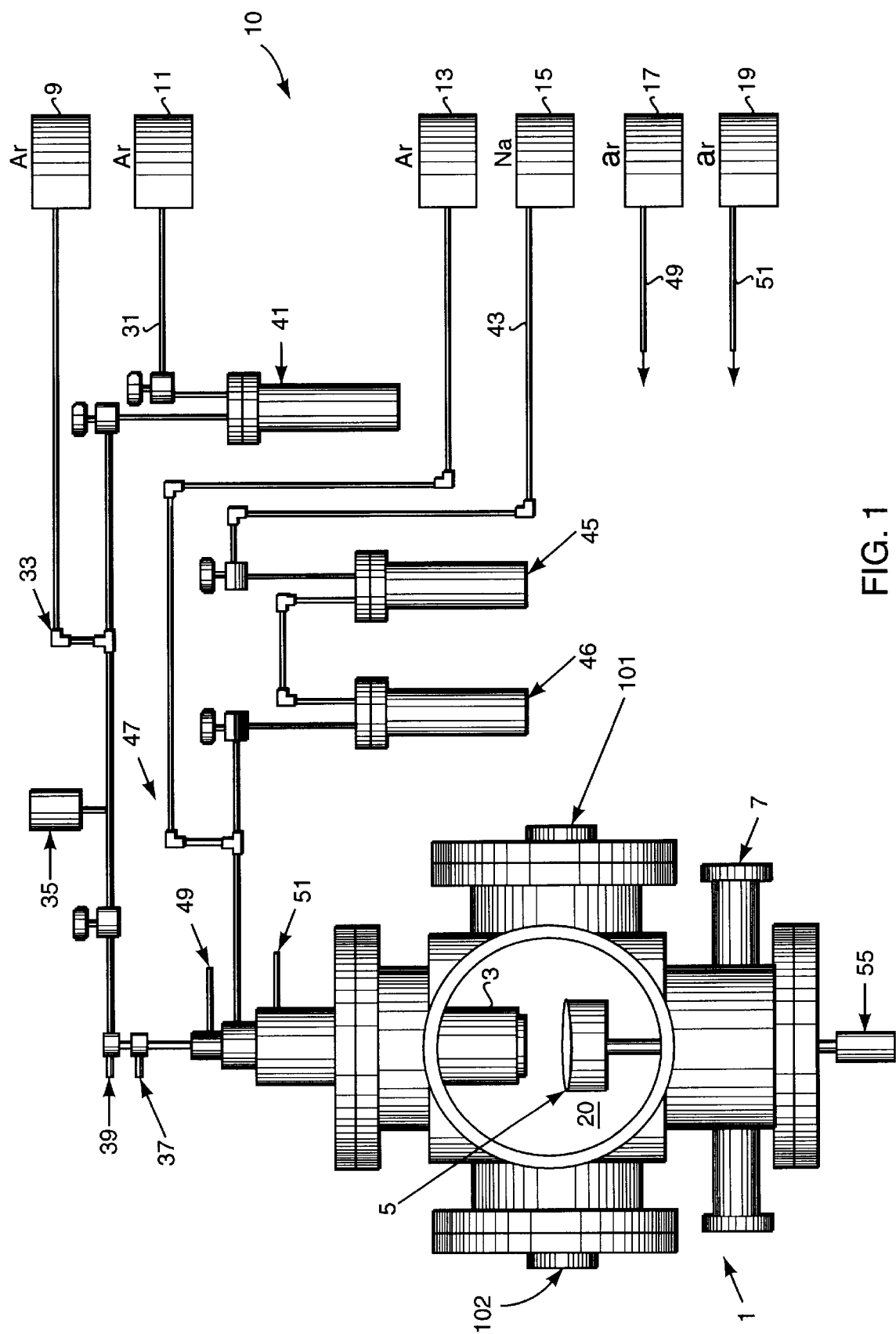
FIG. 1 is an exemplary apparatus for practicing the inventive method.

The present invention offers an improved way to use chemical vapor deposition processing to produce thin films at low cost, with minimal environmental impact, with reasonably high purity and at lower than conventionally used temperatures. The invention relies on the gaseous phase reaction between alkali metals and metal halides to produce the desired thin film material and deposit this material on a substrate, either heated or unheated.

In its broadest embodiment, the invention uses a mixture of at least two precursor gases, one gas being the alkali metal gas and the other gas being the metal halide gas. The alkali metal can be sodium, potassium or other element selected from Group IA. The metal halide is a compound combining a halogen such as chlorine and a material sought to form the thin film structure, either in total or in part. For example, when forming just a metallic thin film structure, the metal halide could be made up of just a metal and the halogen. The metal can be selected from the group of the Group IIIB, IVB, VB, VIB, VIIB, VIIIB, IA, IIA, IIIA, IVA, VA, and VIA elements and combinations thereof.

In an alternative mode, the inventive process can be used to make a ceramic thin film wherein a metal halide could be combined with a non-metal halide. For example, carbon tetrachloride and titanium tetrachloride could be used as precursors to form a titanium carbide thin film.

Typically, the precursor gases include a carrier gas which can be either non-reactive or reactive in terms of producing the thin film. In one mode, argon can be used as the carrier gas for both the alkali metal vapor and the metal halide vapor. In an alternative mode, the carrier gas could be nitrogen which could then also be used as a reactive gas to form a thin film such as titanium nitride. In yet a further embodiment, the gas could be oxygen so as to form a titanium oxide thin film. It should be understood that the choice of the metal and non-metal as part of the metal halide and the reactive or the non-reactive gas can vary depending on the type of thin film sought to be formed. It is believed that any metal or non-metal which can be used in the halide form is adaptable for the present invention.

The thin film made by the inventive process can be used in any application where a thin film is desirable. For example, thin films could be formed for electrical components, devices or the like or as a coating on a substrate for corrosion or wear resistance. The thickness of the thin film can be controlled by controlling the process conditions of the method and apparatus as more fully described below.

The substrate receiving the thin film can also be any type known or contemplated in the art. Preferred substrates include silicon and copper but other substrates can be utilized.

The concentrations of the alkali metal gas and the metal halide gas are controlled so that the alkali metal present strips the halogen from the metal or non-metal sought to be used as part of the thin film. In other words, there should be sufficient alkali metal to reduce the metal halide to its metal form. The concentrations described below are exemplary and other concentrations could be used as would be within the skill of the art.

The chemical vapor deposition process is preferably run at vacuum conditions, more preferably, between 1 and 100 torr, even more preferably, 6 and 50 torr.

The inventive process is also advantageous in that acceptable thin films can be produced at lower than conventional temperatures. Many prior art CVD processes require temperature in excess of 900° C. Thin films using the inventive process can be made at temperatures less than 900° C., and as low as between 250° and 300° C. A preferred temperature range is between about 500° and 700° C. However, the temperature range can vary depending on the materials and Reactant Concentrations being used as part of the reaction chemistry.

One significant aspect of the invention is the ability to suppress particle generation during formation of the thin film. As more fully explained below, operating the inventive process at higher temperatures minimizes salt deposition so as to produce a substantially salt-free thin film, when using sodium as one of the precursor gases. In addition, a lower concentration of the metal halide could be used to reduce salt deposition. The increased operating temperatures tend to increase the vapor pressure of the salt such that an under-saturated condition occurs in the reaction chamber where the thin film is being deposited. The dilute flows of the alkali metal and metal halide contribute to the suppression of particle generation in the gas-phase.

The general chemistry to grow thin film structures is described by the following general equation:

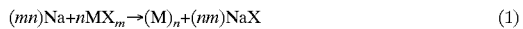
$$(mn)Na + nMX_m \rightarrow (M)_n + (nm)NaX \qquad (1)$$

where Na is sodium, or another alkali metal (e.g., K, Rb, Cs), and $MX_m$ is a metal-halide (M is a metal such as Ti, Ta, Pt, W or the like or other element such as Si, B or C; X is a halogen atom, e.g., chlorine, fluorine or the like; and m and n are integers). The following prototype reactions were investigated to demonstrate that the spontaneous gas-phase alkali metal/metal halide chemistry could be used for the production of metal, alloy and ceramic thin films:

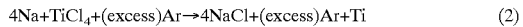
$$4Na + TiCl_4 + (excess)Ar \rightarrow 4NaCl + (excess)Ar + Ti \qquad (2)$$

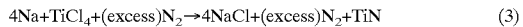
$$4Na + TiCl_4 + (excess)N_2 \rightarrow 4NaCl + (excess)N_2 + TiN \qquad (3)$$

$$4Na + TiCl_4 + (excess)Ar + O_2 \rightarrow 4NaCl + (excess)Ar + O_2 + TiO_2 \qquad (4)$$

In these global reactions, sodium (Na) strips chlorine (Cl) atoms from $TiCl_4$ (typically run as the limiting reagent) leaving titanium atoms which nucleate and grow into a thin film at the substrate surface. Theoretical modeling calculations as would be within the skill of the art and in-situ optical investigations of the reaction chemistry were used to guide both the design and the operational conditions of the reactor so that gas-phase nanoparticle formation could be suppressed. An exemplary apparatus is shown schematically in FIGS. 1 and 2.

The apparatus 10 consists of a stainless steel chamber 1, a nozzle 3 for the introduction of reactants, a temperature programmable substrate heater 5, an outlet 7 for directing the Post-Reaction gases from the reaction chamber 20 to a PCV and pressure-regulated pumping system (not shown), and a bank of six mass flow controllers, 9, 11, 13, 15, 17 and 19. High purity argon gas (99.998) can be used as an exemplary carrier gas but other gases, either reactive or non-reactive, can be used as a carrier and/or reactant. The argon can be additionally purified by passing the gas through an oxygen scrubber consisting of a stainless steel tube packed with copper turnings maintained at 625° C. (not shown). The argon gas can next pass through two water/oxygen gas scrubbers (not shown) before entering a gas manifold which supplies the six mass flow controllers 9, 11, 13, 15, 17 and 19. The mass flow controllers are used to precisely control the flow of argon, $TiCl_4$, and Na entering the reaction chamber 20 through the reaction nozzle 3. The reaction nozzle 3 consists of a series of concentric tubes 21, 23, 25 and 27 (see FIG. 2). The reaction nozzle's center annulus 21 delivers a precisely metered $Ar/TiCl_4$ mixture into the reaction chamber 20. This mixture was prepared by mixing 0.25 to 0.11 standard cubic centimeters per minute (SCCM) of argon gas (line 31) bubbled through liquid $TiCl_4$, held at room temperature (21° C.), with 85 SCCM of argon (line 33). A pressure transducer 35 is used in conjunction with two stainless steel metering valves 37 and 39 to maintain a constant pressure of 780 torr in the $TiCl_4$ bubbler 41, even when the pressure inside the reaction chamber 20 is as low as 6 torr. Sodium vapor is generated by flowing 2–10 SCCM of argon through a liquid sodium bubbler 45 and a liquid sodium trap 46 held at a constant temperature between 300–500° C.

Figure 2:
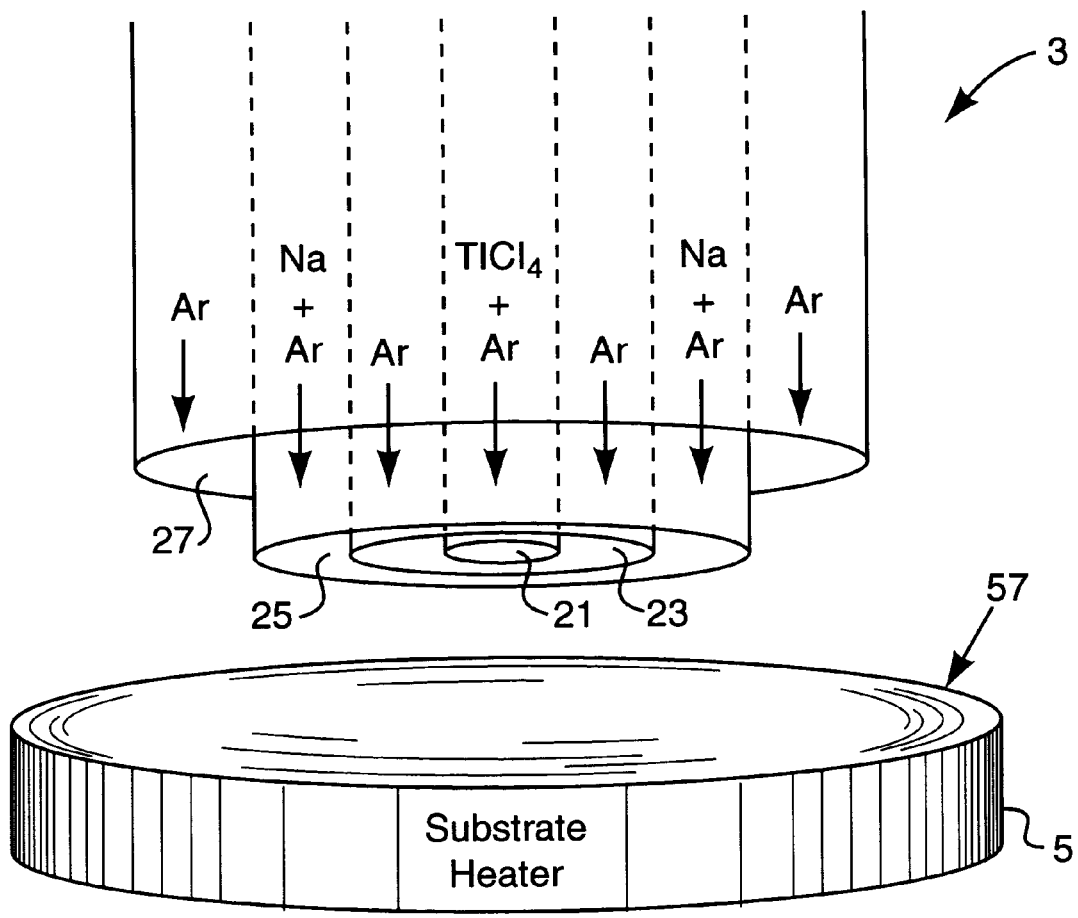
FIG. 2 is a schematic of a nozzle for use in the apparatus of FIG. 1.

The sodium saturated argon flow is further diluted with 915 SCCM of argon (line 47) before being injected into the reaction chamber 20 via the third reaction nozzle annulus 25 (see FIG. 2). An argon gas flow (line 49) of 615 SCCM is injected into the reaction chamber 20 via the second reaction nozzle annulus 23. The flow (line 49) between the $TiCl_4$ and Na vapors prevents the reaction chemistry from occurring at, or inside, the reaction nozzle 3. A final outer shroud (line 51) of 2000 SCCM of argon is injected into the reaction chamber 20 via the fourth annulus 27 of the reaction nozzle 3 to confine the reaction zone 20, to streamline the reactive flow, and to prevent outside contaminants from entering the reaction zone. The latter point is important, as the purity of the reaction zone is primary limited to the purity of the input gases, and is not directly dependent on the quality of the vacuum pumping system. The chamber was held at a constant pressure between 6.00 and 50.0 torr with an automated exhaust throttle valve. At 6.0 torr, the average exit velocity of all reactants and shroud gases was 1910 cm/sec with a Reynolds number of about 144 and a reactant residence time of 2.8 ms, while at 50.0 torr, the average exit velocity of all reactants and shroud gases was 210 cm/sec, with a Reynolds number of about 138.

The molar concentration of sodium vapor at the jet exit is held constant at a value between $1.3 \times 10^{-5}$ and $3.0 \times 10^{-5}$, while the molar concentration of $TiCl_4$ is held at a constant value between $1.6 \times 10^{-5}$ and $3.2 \times 10^{-5}$ (the Na/Cl ratio was fixed at values of between 1.1 and 4.4 for all experimental runs). A 2.0 inch diameter temperature controlled substrate heater 5 is held on a linear-motion feed-through 55 just 1.5 to 2.0 inches (38 to 50 mm) underneath the reaction nozzle 3. The substrate temperature and position can be thus precisely maintained, and easily varied. Quartz windows 101 and 102 on the front and side of the reactor permit the film growth to be monitored visually. The apparatus elements described above are exemplary and other elements or components can be used to achieve the same functions as would be within the skill of the art.

A series of experiments were conducted to determine the effects of substrate material, substrate temperature, and reactor pressure on film composition and quality. The co-flow diffusion flame CVD reactor conditions are summarized in the table of FIG. 11.

A. Ti deposition on Si<100>

Silicon wafers were initially chosen as an easily obtainable, relatively inexpensive, and high quality deposition substrate. The native $SiO_2$ oxide layer was removed by following a modified RCA cleaning procedure as is known in the art. In the final step of the cleaning procedure, the wafer was dipped in a dilute HF solution (50:1 $HF:H_2O$) and then immediately dried, leaving the dangling silicon bonds of the wafer surface hydrogen terminated. Immediately after etching, the wafer was loaded into the reactor. A small amount of suspended silver conductive paste was applied to one side of the wafer to ensure good thermal conductivity between the substrate heater and the wafer. The hydrogen termination layer was desorbed by briefly heating the wafer to 600° C. under vacuum.

Figure 3A:
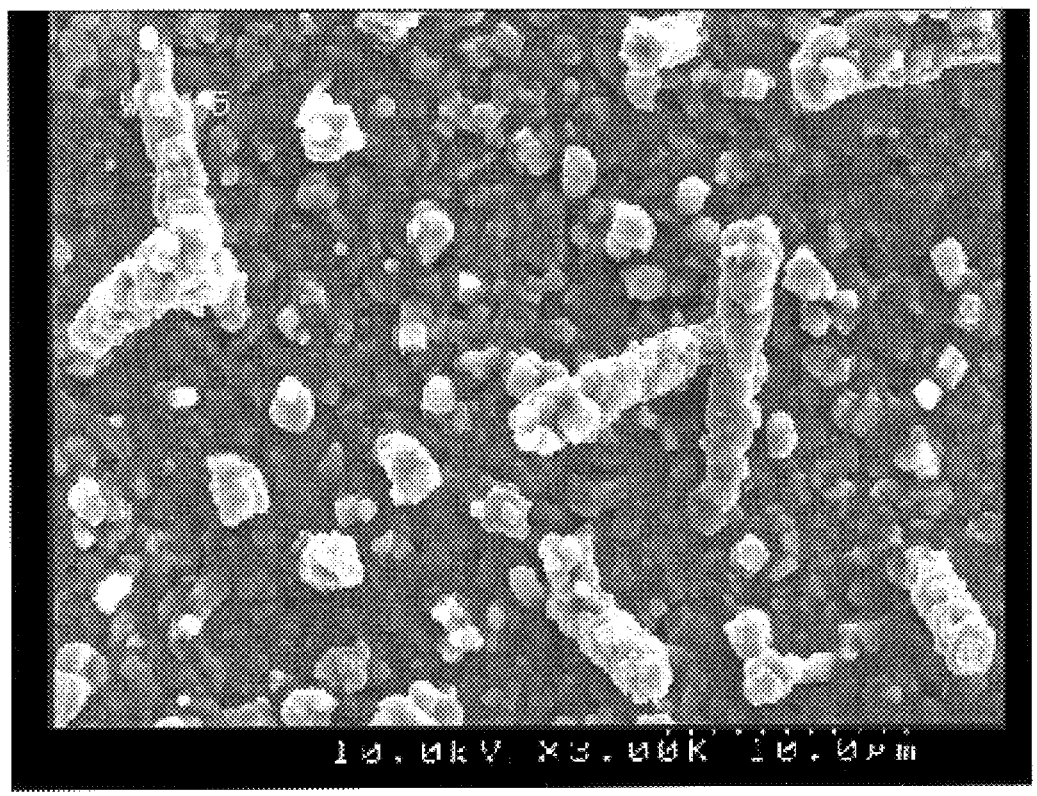
FIG. 3A is an SEM image showing agglomerates of material ranging in size from 1 um to 10 um.
Figure 3B:
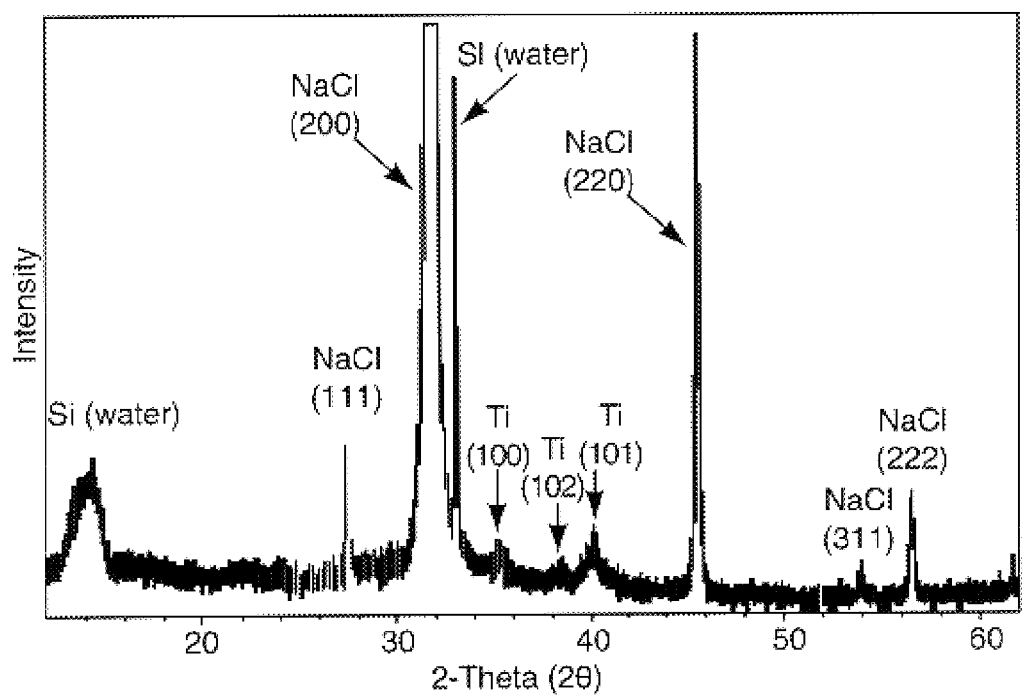
FIG. 3B is a first x-ray diffraction spectrum of a first trial relating to the invention.

For sample R23 (see FIG. 11), the Si<100> substrate temperature was held constant at 435° C., and the reaction chamber was held at 6.00 torr of argon, and the sodium and $TiCl_4$ vapors were introduced into the reaction chamber for a 6½-hour deposition time. The wafer was allowed to cool to room temperature (overnight), and removed from the reaction chamber and quickly placed under an inert atmosphere. The deposited film sample was loaded into a Hitachi 4500 scanning electron microscope (SEM) for analysis. The resulting SEM image showed agglomerates of material ranging in size from 1 um to 10 um. (See FIG. 3A.) X-ray diffraction (XRD) of this film revealed the presence of crystalline sodium chloride and crystalline Ti (see FIG. 3B). The XRD also showed several peaks that are due to the silicon substrate (determined by XRD analysis of a clean silicon <100> wafer taken before film deposition). The presence of salt confirms that reaction (2) was indeed proceeding and that the $TiCl_4$ was reacting with the sodium to release titanium metal and sodium chloride.

Figure 10A:
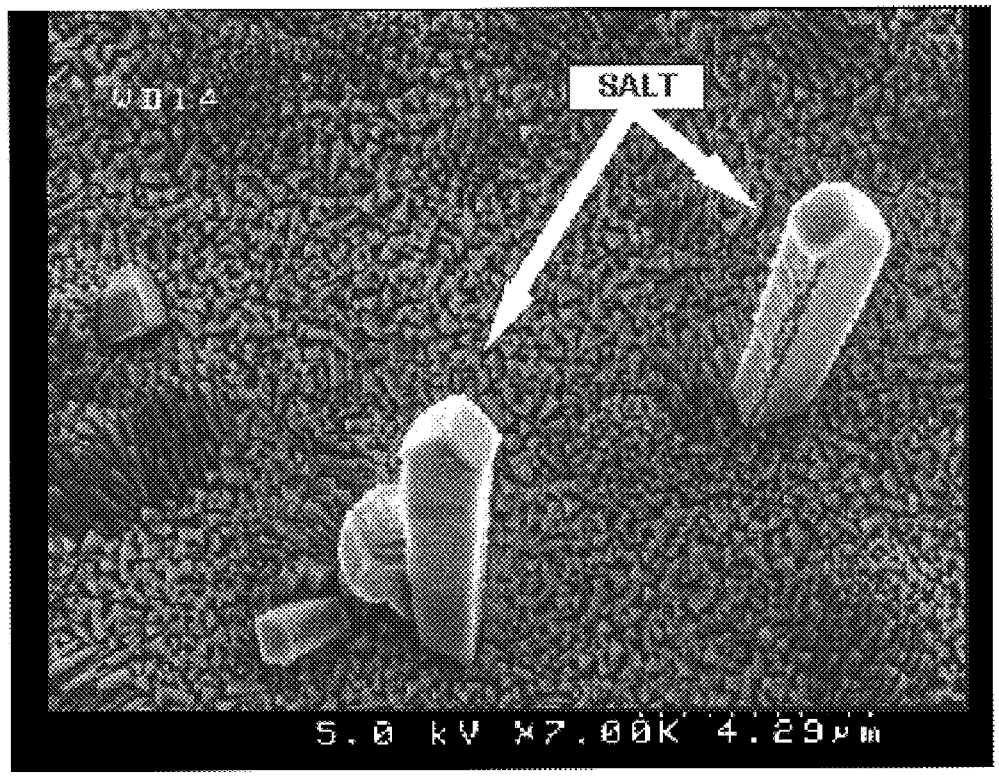
FIG. 10A is an SEM image of the resulting film revealing remarkable salt "towers"
Figure 10B:
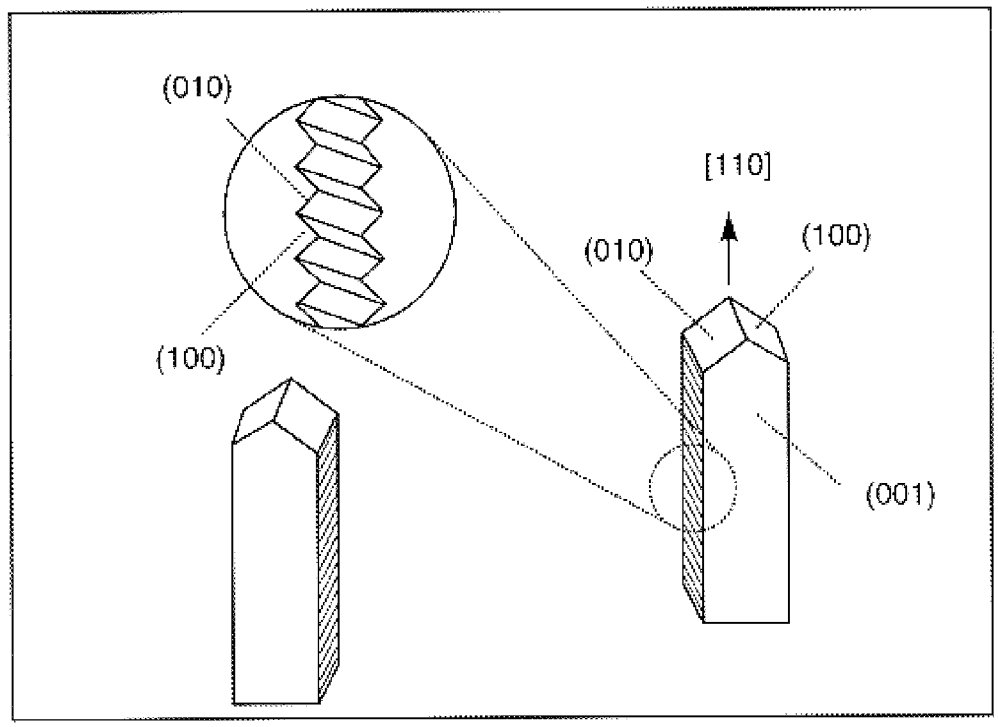
FIG. 10B is a diagram showing the structure of exemplary salt "towers"

Given that the aim of these experiments was to examine the reaction parameters which lead to salt deposition and film morphology, lower substrate temperatures were further explored. Sample R11 was run with a Si<100> substrate temperature of only 260° C. As expected, this resulted in salt deposition enhancement. SEM imagery of the resulting film revealed remarkable salt "towers" (See FIGS. 10A and 10B). X-ray diffraction and Electron Dispersive Spectroscopy (EDS) analysis of this film confirmed the overwhelming presence of NaCl (salt). This trial shows that the gas-phase process lends itself to a high degree of growth rate control via the substrate temperature by comparing the two trials described above. The edge of the salt tower clearly shows that faceted crystal growth has occurred. The tower shape appears to be due to rapid growth along the [110] direction orthogonal to the substrate surface.

Figure 4A:
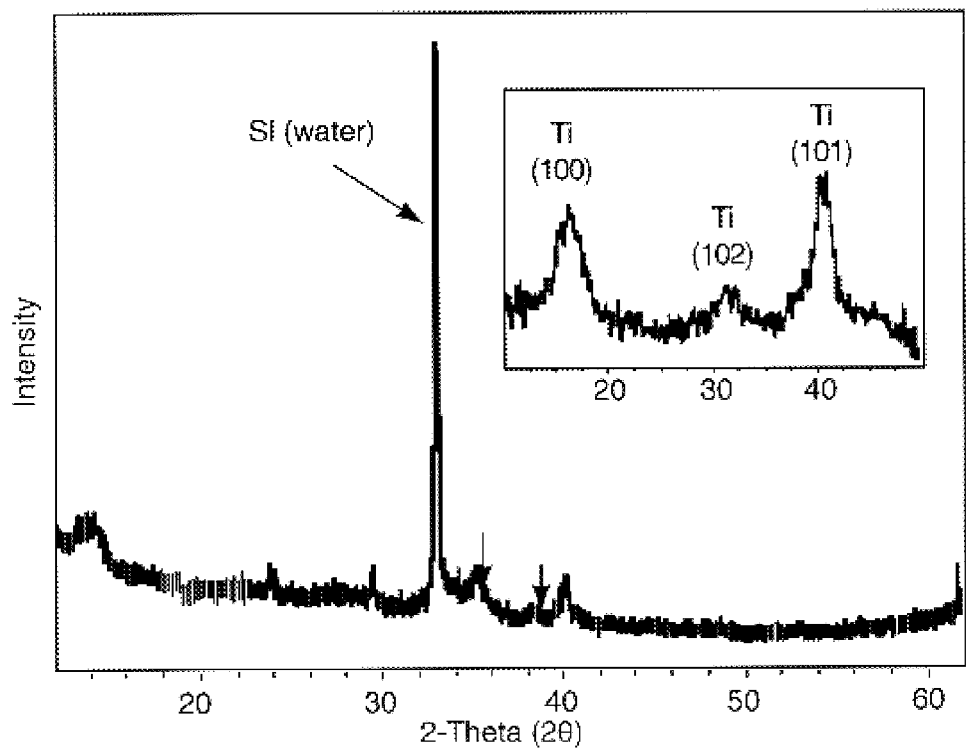
FIG. 4A is a second x-ray diffraction spectrum relating to the invention.
Figure 4B:
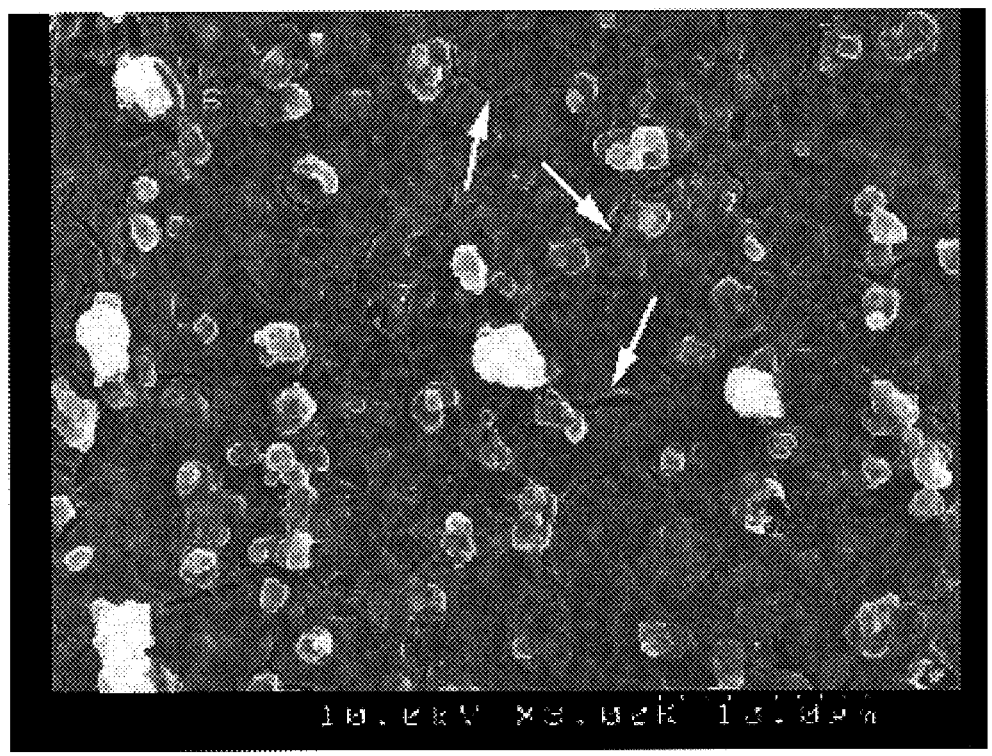
FIG. 4B is an SEM image showing cracks in the post-washed film indicating that removal of the salt has stressed the film surface.

Salt is highly soluble in water, and an experiment was conducted to determine if the salt co-deposited with the titanium in sample R23 could be removed by washing the substrate in water. The film was soaked overnight in pre-boiled room temperature distilled and deionized water. X-ray analysis of the post-washed film revealed that the salt had been removed, as can be seen by the absence of NaCl peaks in the x-ray diffraction pattern (see FIG. 4A). The insert in FIG. 4A clearly shows the presence of titanium, and from the Full-Width-at-Half-Maximum (FWHM) of the peak centered at 2-theta=40.3 degrees, a crystallite size of 20 nm is inferred from the Scherrer Equation. While washing the film removes excess salt, it is unlikely to produce a high quality titanium film. Cracks are visible in SEM imagery (see FIG. 4B) of the post-washed film indicating that removal of the salt has stressed the film surface. A transmission electron microscope (TEM) image of the film showed that the particles were between 1 nm and 10 nm, which compares well with the 20 nm crystallite size determined by XRD. The particles were imaged using a Phillips EM400 transmission electron microscopy equipped with an NORAN Explorer x-ray detector, allowing chemical analysis of the particles by energy dispersive x-ray spectrometry (EDS) and Selected Area Electron Diffraction (SAED). The EDS spectrum revealed the presence of oxygen, titanium, iron, and copper. The copper signal is from the TEM grid, and the oxygen is probably due to titanium oxides that formed when the sample was handled in air, and washed with water. The presence of iron is not as clear, and is likely to be an impurity in the $TiCl_4$ liquid feed-stock. The SAED pattern showed that a polycrystalline structure was present.

Previously, Ti nanoparticles encased in a salt shell were produced by reacting $TiCl_4$ and Na in a co-flow flame reactor. It was found that the salt coating arrested further growth of the Ti nanoparticles. While this effect is desirable for the production of nanoparticles (it can be used to control size, shape, and degree of agglomeration), it is not desirable for thin film growth. Therefore, finding reaction conditions which minimize the amount of deposited salt was sought.

B. Ti Deposited at Lower Supersaturation of Salt on Si<100>Substrates

Figure 8:
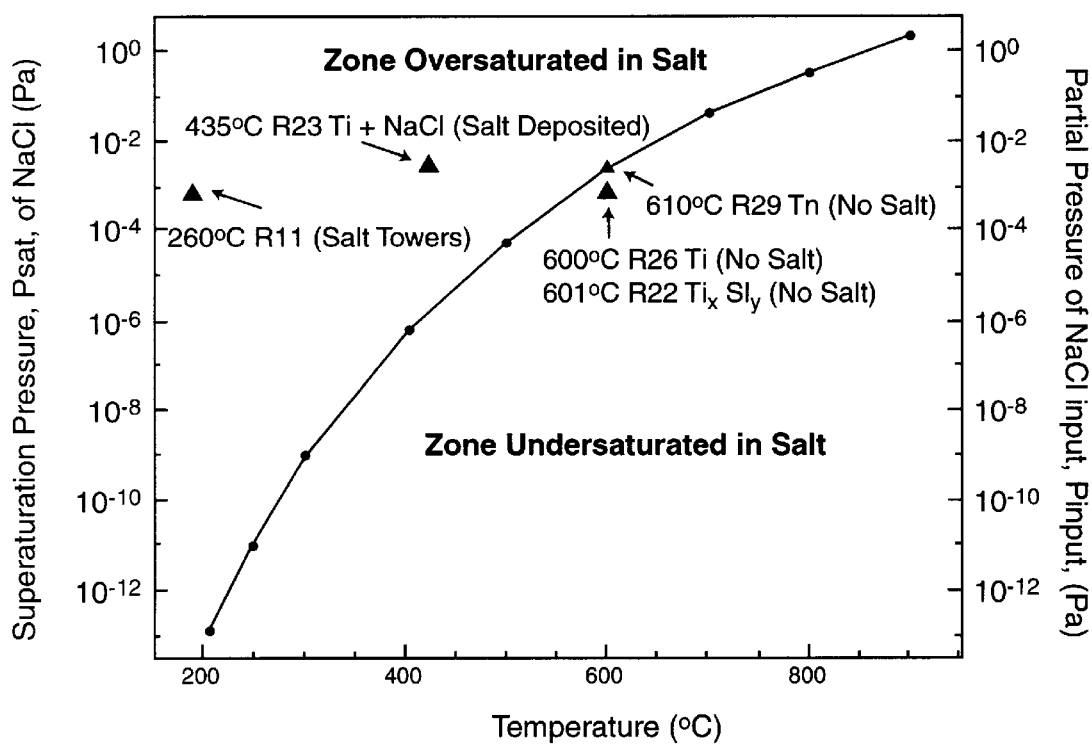
FIG. 8 is a plot of the partial pressure of salt vs. temperature determined from the thermodynamic calculations for certain test runs.

Having demonstrated that the vapor phase chemistry could be driven at low temperatures, the next investigation was whether a film could be deposited under conditions that were under saturated in the salt concentration. Running the substrate at higher temperatures increased the vapor pressure of the salt and led to a salt free titanium film. Thermodynamics calculations indicated that under the reactant concentrations used in the previous trials, a substrate temperature of 600° C. would produce reaction conditions that were under-saturated in salt. Shown in FIG. 8 is a plot of the partial pressure of salt vs. temperature determined from the thermodynamic calculations. Reaction conditions falling on points above the solid line are over-saturated in salt (salt will deposit on the substrate) while those below it will be under-saturated in salt (salt will not deposit on the substrate). The concentration of salt input into the reaction zone for individuals runs was determined by assuming 100% reaction of $TiCl_4$ ($TiCl_4$ was the limiting reagent). FIG. 8 shows that samples R11 and R23 were run with conditions which were oversaturated in salt leading to salt contaminated films. Samples R22 and R26 were run with higher substrate temperatures and should therefore be salt free.

Figure 5A:
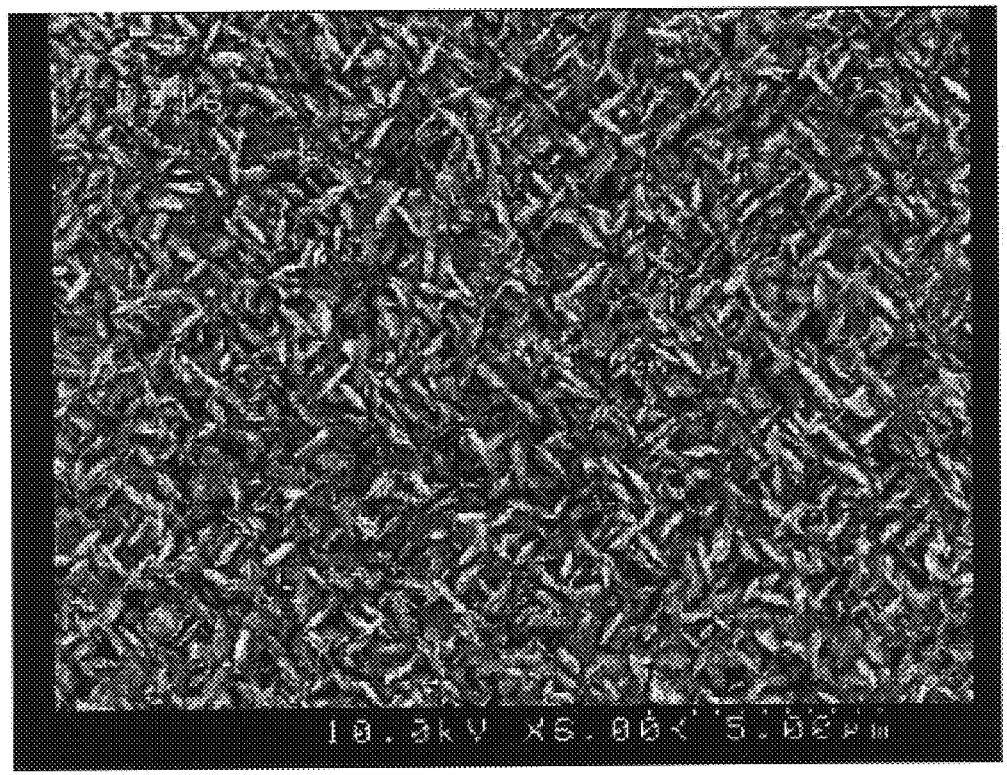
FIG. 5A is an SEM image of the resulting film morphology showing two preferred growth orientations which are orthogonal to each other.

A deposition experiment was performed at 600° C. on a Si<100>(see sample R22, FIG. 11). The resulting film is very different from previous runs (Samples R23, R11 and R23W) both in morphology, and in chemical composition. A SEM image of the resulting film morphology showed two preferred growth orientations which are orthogonal to each other (see FIG. 5A). The "needle-like" shape of the crystallites indicated that the chemical composition of the film was also different from the previous sample runs. X-ray diffraction of the film confirmed that no sodium chloride was present, and that no titanium was present. The higher temperature had successfully prevented the deposition of salt.

Figure 5B:
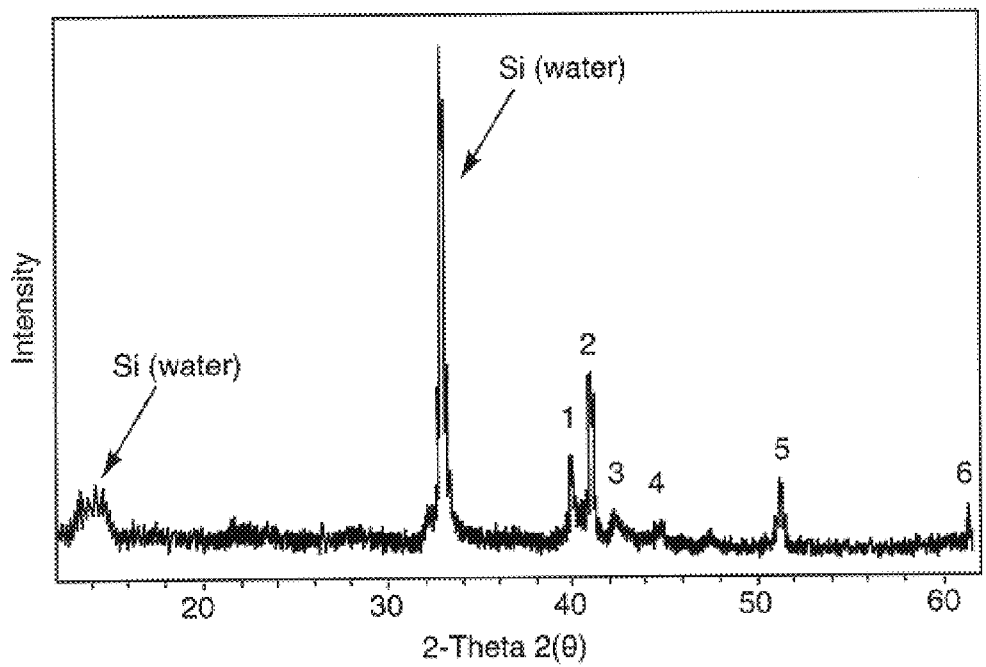
FIG. 5B is a third x-ray diffraction spectrum relating to the invention.

However, at temperatures above 450° C., titanium deposited on silicon converted to titanium silicides (TiSi, $TiSi_2$, $Ti_5Si_3$, $Ti_5Si_4$) as has been previously reported in the literature. The formation of titanium suicides was confirmed by x-ray analysis as shown in FIGS. 5 and 13. A Raman spectrum of sample R22 further confirmed the presence of titanium silicide ($TiSi_2$, C49 phase, the other silicide phases were not detected in the Raman spectrum), as well as some $Ti_2O_3$. Given the surface sensitive nature of Raman spectroscopy, it not surprising that any small amounts of unreacted titanium would convert to titanium oxides, especially given that the Raman technique involved some sample heating with the incident laser which took place in an air environment.

In order to confirm that $TiCl_4$ was not just reacting with the 600° C. silicon surface, sample R15 was run in the absence of sodium vapor. As expected, EDS and SEM of sample R15 showed that no film formed.

C. Ti Deposited on Cu Substrates

Figure 6:
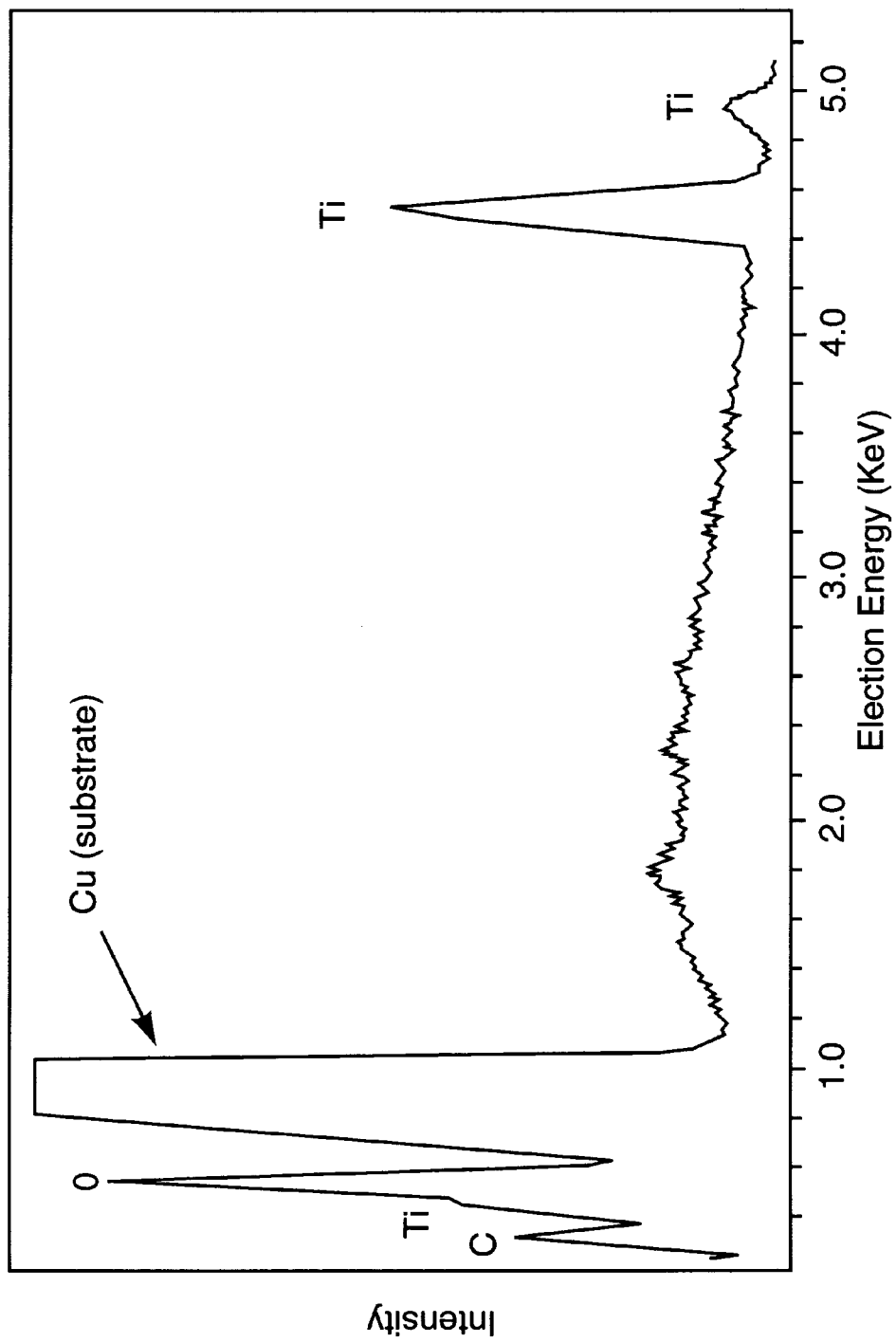
FIG. 6 is a first electron dispersive spectroscopy analysis relating to the invention.
Figure 7A:
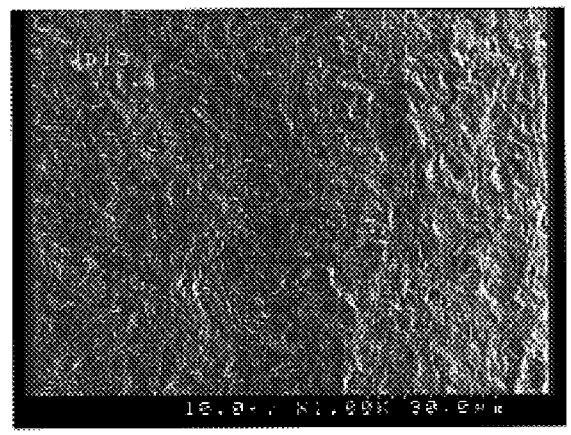
FIG. 7A is a first SEM image of sample R26 taken at image magnification of 1,000 showing the surface to be free of the tortoise shell appearance.
Figure 7B:
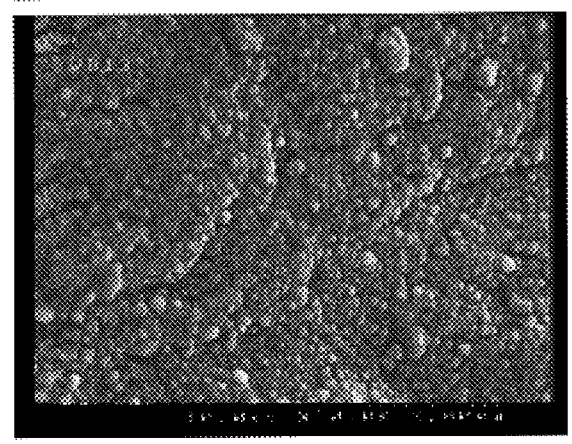
FIG. 7B is a second SEM image of sample R26 taken at image magnification of 10,000.
Figure 7C:
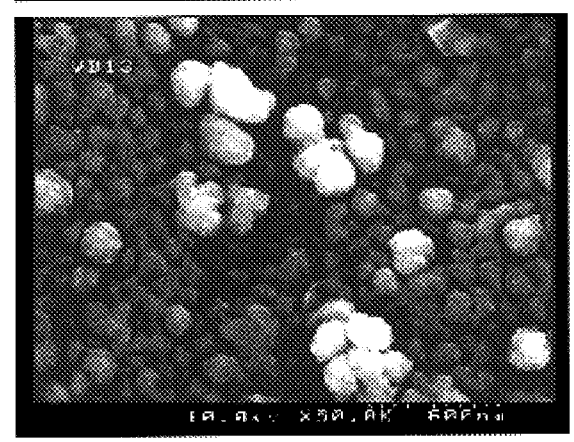
FIG. 7C is a third SEM image of sample R26 taken at image magnification of 50,000.
Figure 7D:
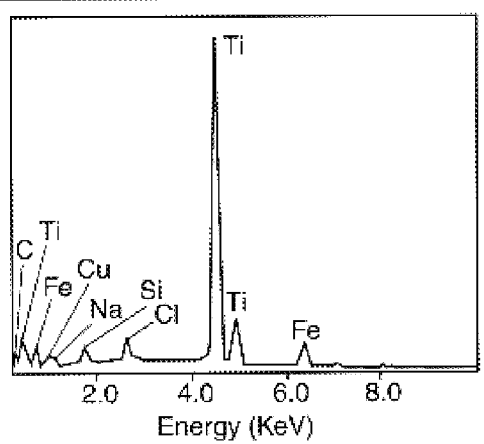
FIG. 7D is a second electron dispersive spectroscopy analysis relating to the invention.

Copper was chosen as a substrate material since it could be heated to 610° C., and does not readily form titanium alloys at this temperature, and therefore would not suffer from the analogous problem of forming titanium silicides when depositing titanium on a silicon substrate. Sample R25 (see FIG. 11) was run with a substrate temperature of 610° C. and $2.9 \times 10^{-3}$ SCCM $TiCl_4$ vapor (the same conditions used to prepare sample R22). The 610° C. substrate temperature, and the lower concentration of $TiCl_4$ both acted to reduce salt deposition. The copper substrate was prepared by sanding OFHC copper with #400 sandpaper. The resulting film was analyzed by SEM and by EDS. These analyses showed the film to have a unique morphology, and it is clearly different from the sample R22 run with the same reactor conditions with the exception of differing substrate materials (see FIG. 11). EDS of the sample R25, see FIG. 6, confirmed that titanium is indeed present. Carbon and oxygen signals were also observed, the most dominant signal being copper from the underlying substrate material. Virtually no sodium chloride signals are seen, that is, sample R25 appears to be a salt-free titanium film deposited on copper. Visual inspection of the substrate both before and after deposition also confirms that titanium had been deposited. The copper colored substrate turned into a steel gray colored surface which is the color of bulk titanium metal. A tortoise shell appearance, or cracking of the film surface, was present and is likely to be the result of the rough substrate surface prior to deposition. To confirm this, several OFHC substrates were polished with 1 micron $Al_2O_3$ prior to deposition of samples R26, R30, and R32. SEM images of sample R26 (see FIGS. 7A, 7B, and 7C) showed the surface to be free of the tortoise shell appearance. Visual inspection of the sample shows a uniform steel-gray color film which coats the copper colored substrate. An EDS spectrum taken of this film (FIG. 7D) shows no oxygen signal, and trace signals for Cu, Na, Si, Cl, and Fe. The weak copper signal seen in FIG. 7D vs. FIG. 6 is most likely due to film thickness (a thicker titanium film suppresses the underlying copper signal, both EDS spectra were taken with the same incident electron beam energy of 10 KeV). The presence of iron and silicon are likely to be the result of impurities in the stock $TlCl_4$ used for all of these experiments (99.9% purity). The XRD Spectrum of sample R26 produced only a noisy signal absent of all peaks (including Ti and/or NaCl). One reason for this could be due to the film being polycrystalline with a very small grain size. The experimental difficulty in obtaining an XRD titanium signal from sample R26 was in part due to the inherently more noisy copper substrate (as compared with the single crystal silicon substrates for which obtaining a Ti signal was possible).

To further characterize the copper substrate films, transmission electron micrographs were taken. A TEM grid of sample R26 was prepared by carefully scraping the film with a carbide scribe to remove the film, and transfer it to the TEM grid via a very dilute alcohol suspension containing the film scrapings. The resulting TEM micrograph showed the nanostructure of the film. A selected area electron diffraction pattern (SAED) of this particle showed that it was indeed a polycrystalline material.

D. TiN Deposited on Cu

To further illustrate the versatility of the co-flow sodium metal/metal halide CVD reactor and process, an experiment was performed which explored the growth of a ceramic film. Titanium nitride was chosen given the simplicity of the reaction chemistry (see equation 3), and because it is of interest to the materials coating industries due to its ability to reduce wear and extend life of machine tooling cutting surfaces. By simply replacing argon with nitrogen (see equations 2 and 3) a titanium nitride film should be produced. The titanium nitride film also has the advantage that surface oxidation does not occur when it is handled in air.

Figure 9A:
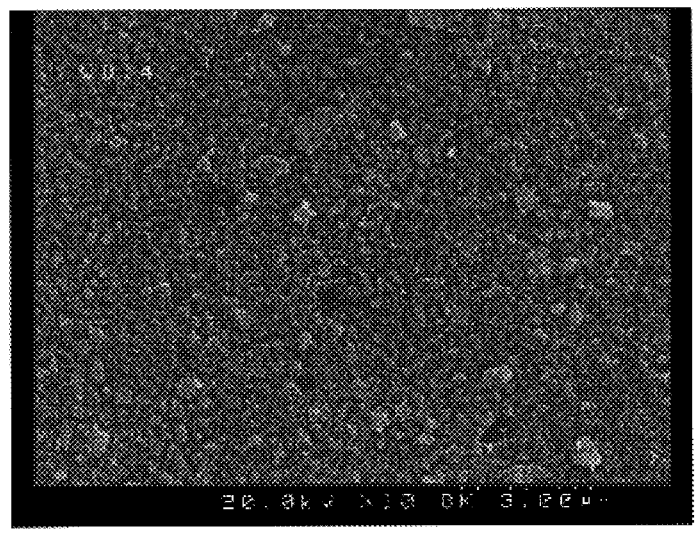
FIG. 9A is a first SEM image of the resulting film showing that the film consists of cubic crystallites with an edge length of about 60 nm.
Figure 9B:
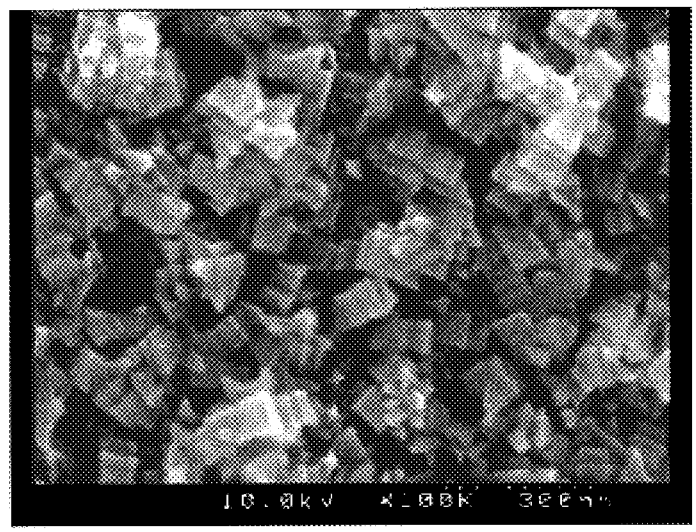
FIG. 9B is a second SEM image of the resulting film showing that the film consists of cubic crystallites with an edge length of about 60 nm.

The aim of this experiment was to grow a salt free TiN film using a polished OFHC copper substrate material. Sample R29 was run with a substrate temperature of 610° C., and $3.3 \times 10^{-3}$ SCCM $TiCl_4$ vapor, and $5.3 \times 10^{-3}$ SCCM Na vapor (see FIG. 11). SEM images of the resulting film showed clearly that the film consists of cubic crystallites with an edge length of about 60 nm (see FIGS. 9A and 9B). The crystallites also appeared to form stacks, an indication that surface growth is indeed occurring. A TEM grid was prepared in a manner similar to that previously described for R26, and the resulting TEM image verified the existence of the titanium nitride. A selected area diffraction pattern showed that a polycrystalline film had been produced. EDS revealed the presence of titanium, copper, iron, oxygen, nitrogen and carbon. Copper signals are from the TEM grid or from the copper substrate, and iron, carbon, and oxygen only appeared in trace signal levels. There was no evidence of sodium or chlorine (within the 1.0% weight percent detection limit for EDS), which confirmed that a salt free titanium nitride film has been successfully deposited.

Figure 9C:
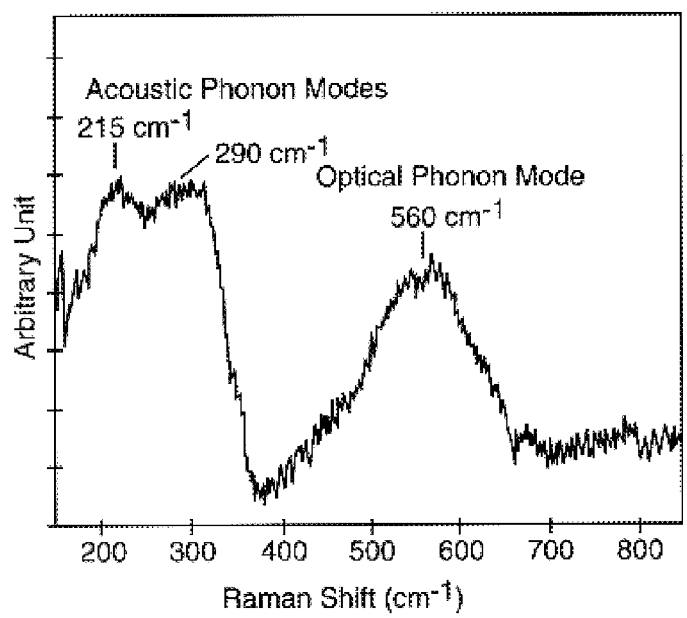
FIG. 9C is a Raman spectrum of the TiN sample.

A Raman spectrum of the TiN sample is shown in FIG. 9C. This figure shows peaks at 215 $cm^{-1}$, 290 $cm^{-1}$, and 560 $cm^{-1}$. The peaks at 215 $cm^{-1}$ and 290 $cm^{-1}$ correspond to the acoustic phonon modes of TiN which are in excellent agreement with the previously measured values of 200 $cm^{-1}$ and 285 $cm^{-1}$ for $TiN_x$, where x=0.995. The peak at 560 $cm^{-1}$ corresponds to the optical phonon mode of TiN previously measured to be from 520 $cm^{-1}$ to 550 $cm^{-1}$ for $TiN_x$, where x=0.995. Furthermore, the presence of $Ti_2O_3$, $TiO_2$ and TiO were not detected in the Raman spectrum. If $TiO_2$ was present (in even small amounts) it would have been readily detected due to the fact that it is non-cubic and highly polarizable (it is a strong Raman scatter) in comparison with stoichiometric cubic TiN (for which first-order scattering is forbidden).

The trials described above show that titanium, and titanium nitride films have been deposited on copper substrates at 610° C., which is a very favorable temperature compared to conventional CVD process for depositing titanium which is in excess of 900° C. Titanium silicide films were also prepared on Si<100> substrates at 610° C. At lower temperatures (260° C.), salt contaminated Ti films were grown on the silicon wafers.

The inventive low pressure co-flow alkali metal/metal halide reactor process provides an improved method for thin film growth, and has the attraction of being of lower temperature than many conventional CVD routes. Furthermore, this technique should be completely general to a wide class of ceramic and metal films. For example, by switching the metal halide a very wide variety of thin film materials could be easily grown (see FIG. 12). Finally, this new technique for thin film growth has the additional benefit that the salt by-products from the reaction are environmentally benign.

As such, an invention has been disclosed in terms of preferred embodiments thereof which fulfill each and every one of the objects of the present invention as set forth above and provides a new and improved apparatus for and a method of forming thin film structures.

Of course, various changes, modifications and alterations from the teachings of the present invention may be contemplated by those skilled in the art without departing from the intended spirit and scope thereof. It is intended that the present invention only be limited by the terms of the appended claims.

What is claimed is:

1. A method of forming a thin film of material on a substrate comprising the steps of:
   a) providing a first precursor gas comprising an alkali metal;
   b) providing at least one second precursor gas comprising a halide compound gas wherein the halide compound includes at least one component of the material;
   c) reacting the first and second precursor gases under gaseous and vacuum conditions of less than 100 torr to form the material and depositing the material on the substrate.

2. The method of claim 1, wherein the first precursor gas is an alkali metal selected from the group consisting of sodium, potassium, rubidium, and cesium.

3. The method of claim 1, wherein the halide compound includes metals, non-metals, semiconductors, and combinations thereof.

4. The method of claim 3, wherein the metal is selected from the group consisting of the Group IIIB, IVB, VB, VIB, VIIB, VIIIB, IA, IIA, IIIA, IVA, VA, and VIA elements and combinations thereof.

5. The method of claim 1, wherein the halide compound is selected from the group consisting of boron, C, S; and Groups VA, and VIA elements.

6. The method of claim 1, wherein the halide compound includes a halogen element selected from the group consisting of chlorine, fluorine, bromine and iodine.

7. The method of claim 1, further comprising providing a carrier gas as part of said reacting step.

8. The method of claim 7, wherein the carrier gas is one of a non-reactive and a reactive gas.

9. The method of claim 7, wherein the carrier gas is included as part of each of the first and second precursor gases.

10. The method of claim 7, wherein the carrier gas is one of oxygen, nitrogen, helium, and argon.

11. The method of claim 1, wherein the first and second precursor gases are arranged as dual flow streams prior to the reacting step.

12. The method of claim 11, wherein a separator gas is provided between the dual flow streams prior to the reacting step.

13. The method of claim 1, wherein the first precursor gas is sodium and the at least one second precursor halide compound gas is selected from the group consisting of $TiCl_4$, $SiCl_4$, $SiHCl_3$, $TaCl_5$, $BCl_3$, $CCl_4$, and combinations thereof.

14. The method of claim 13, wherein each of the first and second precursor gases include one of argon, oxygen, helium, and nitrogen.

15. The method of claim 1, wherein the reacting step is performed at an elevated temperature less than 900° C.

16. A method of forming a thin film of material on a substrate comprising the steps of:
   a) providing a first precursor gas comprising an alkali metal;
   b) providing at least one second precursor gas comprising a halide compound gas wherein the halide compound includes at least one component of the material;
   c) reacting the first and second precursor gases under gaseous conditions at an elevated temperature and less than 100 torr to form the material and depositing the material on the substrate.

17. The method of claim 16, wherein the alkali metal is selected from the group consisting of sodium, potassium, rubidium, and cesium, the halide compound includes metals, non-metals, and combinations thereof.

18. The method of claim 17, wherein the first precursor gas is sodium and the halide compound is selected from the group consisting of $TiCl_4$, $SiCl_4$, $SiHCl_3$, $TaCl_5$, $BCl_3$, $CCl_4$, and combinations thereof.

* * * * *